United States Patent [19] [11] Patent Number: 4,939,789
Sakashita et al. [45] Date of Patent: Jul. 3, 1990

[54] SIGNAL RECEIVER FOR TERRESTRIAL AND SATELLITE BROADCASTINGS

[75] Inventors: Seiji Sakashita, Yawata; Hiroaki Ozeki, Neyagawa; Ippei Kanno, Hirakata, all of Japan

[73] Assignee: Matsushita Electric Industrial Co., Ltd., Osaka, Japan

[21] Appl. No.: 145,872

[22] Filed: Jan. 20, 1988

[51] Int. Cl.$^5$ .............................................. H04B 1/16
[52] U.S. Cl. ................................... 455/260; 455/180; 455/142; 455/197; 358/191.1
[58] Field of Search ................ 455/260, 180, 188, 196, 455/197, 266, 142, 144; 358/191.1, 189

[56] References Cited

U.S. PATENT DOCUMENTS

| 4,079,330 | 3/1978 | Ishigaki et al. | 329/134 |
| 4,658,437 | 4/1987 | Ersoz et al. | 455/180 |
| 4,667,243 | 5/1987 | Blatter et al. | 358/191.1 |
| 4,691,356 | 9/1987 | Ichikawa | 455/142 |

FOREIGN PATENT DOCUMENTS

| 0178146 | 4/1986 | European Pat. Off. . |
| 0199887 | 11/1986 | European Pat. Off. . |
| 3226980 | 1/1984 | Fed. Rep. of Germany . |
| 0155885 | 9/1982 | Japan | 358/189 |

OTHER PUBLICATIONS

Specifications for Sprucer II, 444 MHZ convertor; Kanematsu-Gosho (USA) Inc.
Service Manual for Video Switcher TZ-SW200P, Panasonic.
"Advanced Threshold-Extension Tracking Filter for Satellite Video Reception", W. M. Rogers; IEEE National Telecommunications Conference, New Orleans, Louisiana, Nov. 29-Dec. 3, 1981, vol. 3, pp. E6.5.1–E6.5.7.
"SHF Direct Satellite Broadcasting Receiver", Y. Shiomi et al., National Technical Report, vol. 30, No. 1, Feb. 1984, pp. 4–12.
"Toshiba Television with Built-In BS Tuner 21V230", Television Technics & Electronics, vol. 32, No. 9, Sept. 1984, pp. 30–35.
Television Picture Engineering Handbook, vol. 10, Chapter 1, pp. 963–965, 1980, by the Institute of Television Engineers of Japan.

Primary Examiner—Benedict V. Safourek
Assistant Examiner—Ralph Smith
Attorney, Agent, or Firm—Wenderoth, Lind & Ponack

[57] ABSTRACT

A signal receiver which is capable of receiving and demodulating a satellite broadcasting signal which is an FM signal and a terrestrial broadcasting signal which is an AM signal is disclosed. FM and AM signals are frequency-converted into signals having frequencies in a same intermediate frequency band by making common use of a radio frequency amplifier, a mixer, a local oscillator and an intermediate frequency filter. At the time of reception of an FM signal, the FM signal is demodulated in a phase-locked loop circuit, and a local oscillator is subjected to frequency modulation by a part of the demodulated signal, thereby constituting an FM negative feedback loop, and thus narrowing the occupied bandwidth of the FM signal. At the time of reception of an AM signal, the phase-locked loop circuit is used to regenerate a carrier, and the output signal of the phase-locked loop circuit is input to a multiplier to effect synchronous detection of the input signal. At this time, the FM negative feedback to the local oscillator is utilized to effect automatic frequency control, thereby achieving stabilization of the synchronous detection.

15 Claims, 11 Drawing Sheets

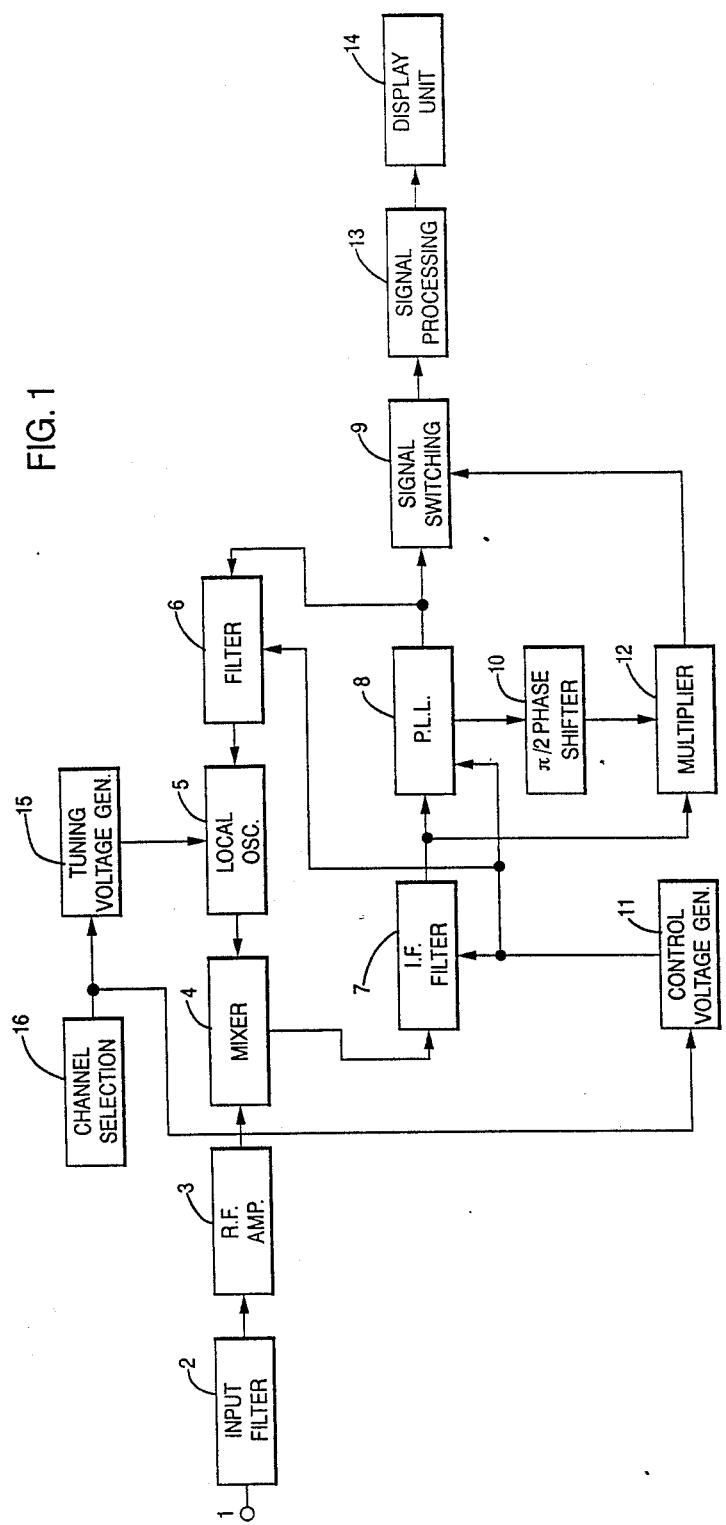

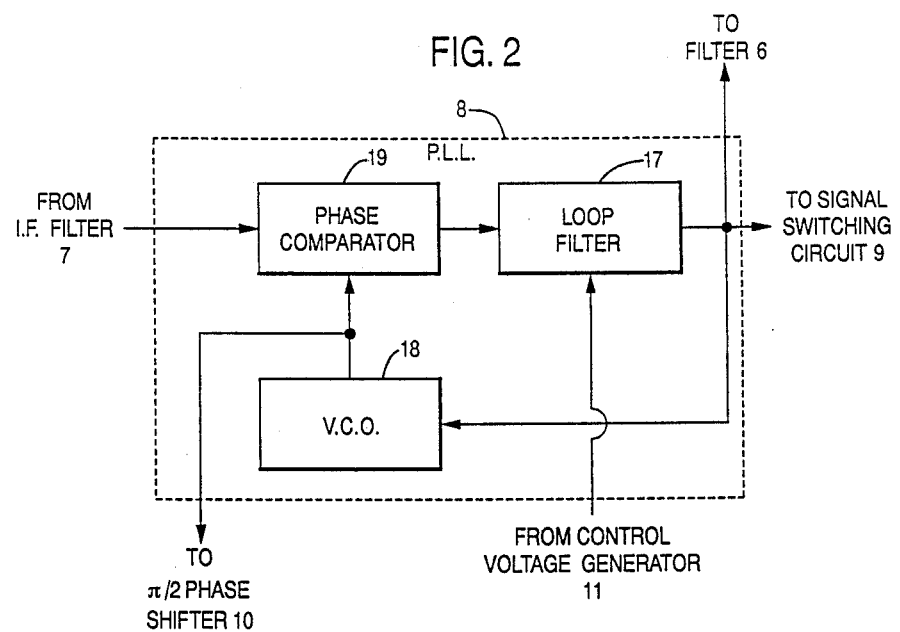
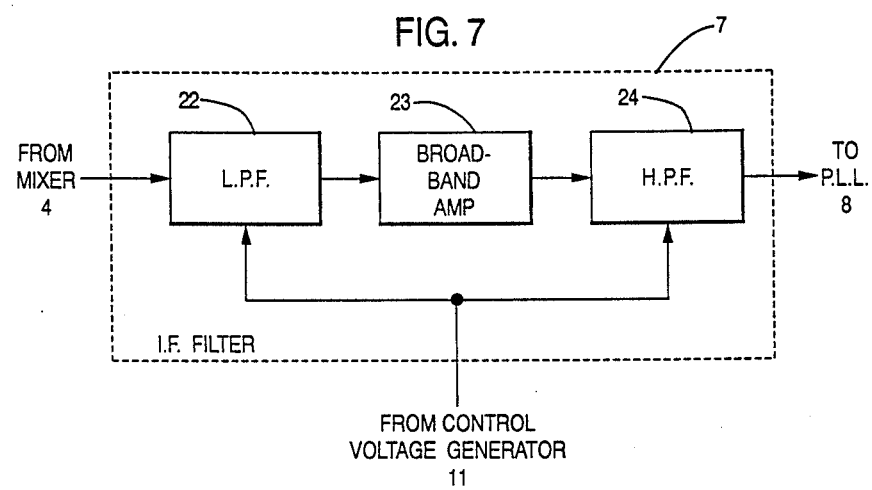

$f_m$ : TOP BASEBAND FREQUENCY $f_1$ : INTERMEDIATE FREQUENCY $\Delta f_1, \Delta f_2, \Delta f_3$ : PEAK FREQUENCY DEVIATION fp : PICTURE CARRIER
fs : SOUND CARRIER

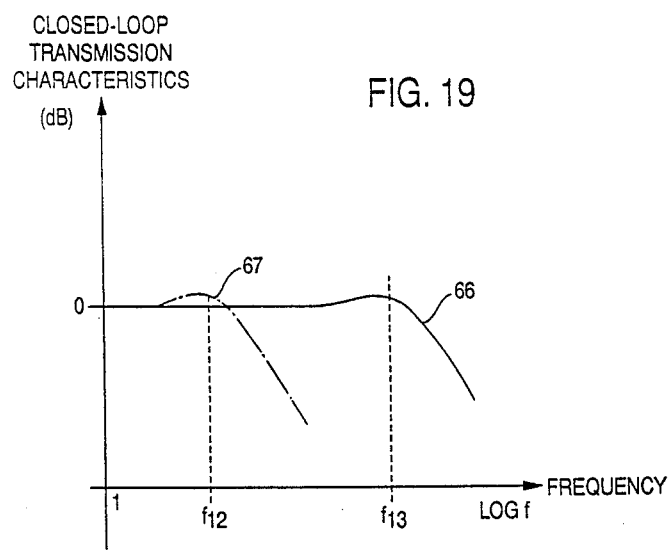
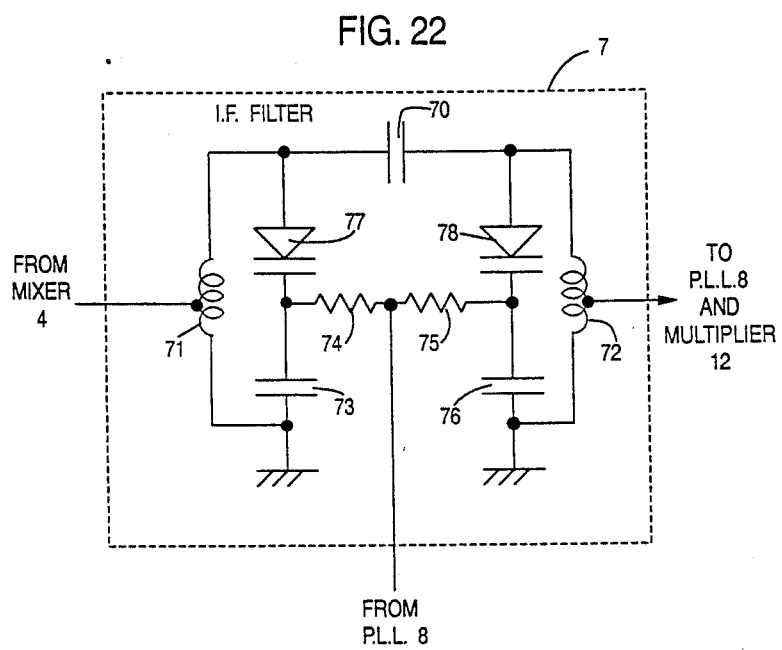

fm: TOP BASEBAND FREQUENCY
$f_1$: CENTER FREQUENCY
$\Delta f_3$: PEAK FREQUENCY DEVIATION

SIGNAL RECEIVER FOR TERRESTRIAL AND SATELLITE BROADCASTINGS

BACKGROUND OF THE INVENTION

1. Field of the Invention

The present invention relates to a signal receiver which can be effectively used for a tuner of a television receiver.

2. Description of the Prior Art

In television broadcasting, amplitude modulation (hereinafter referred to as "AM") is used in the terrestrial broadcasting systems, and frequency modulation (hereinafter referred to as "FM") is utilized in the satellite broadcasting systems. A typical conventional television receiver has an AM signal demodulator for reception of terrestrial broadcasting and no FM signal demodulator is incorporated therein. Accordingly, in order to receive satellite broadcasting, an additional special-purpose receiver unit (i.e., an FM signal demodulator) must be connected to the television receiver.

Examples of the conventional special-purpose receiver units include the external adapter type as shown in "SHF Direct Satellite Broadcasting Receiver", Y. Shiomi et al., National Technical Report, Vol. 30, No. 1 FEB, 1984, pp. 4–12 and the built-in type as shown in "Toshiba Television With Built-In BS Tuner 21V230", Television Technics & Electronics, Vol. 32 No. 9, September 1984, pp. 30-35 .

These prior arts suffer, however, from a high degree of redundancy in the circuit configuration, high production cost and large circuit size because two different kinds of receiving systems are employed to receive satellite broadcasting and terrestrial broadcasting, respectively.

SUMMARY OF THE INVENTION

It is a primary object of the present invention to provide a signal receiver which can receive satellite and terrestrial broadcasting television signals with a simple, low-cost and small-size circuit.

The present invention provides a signal receiver wherein a broad-band radio frequency amplifier, a mixer and a local oscillator are used in common for receiving satellite and terrestrial broadcasting television signals, which are converted into signals having a same intermediate frequency band by the local oscillator and the mixer. Further, the occupied frequency bandwidths used to receive satellite and terrestrial broadcasting television signals are made equal to each other, so that a single intermediate frequency filter is used to remove unnecessary signals. During the reception of satellite broadcasting, a phase-locked loop circuit is operated as an FM signal demodulator, and a local oscillator is subjected to frequency modulation by a part of the demodulated signal to effect an FM negative feedback operation, thereby narrowing the occupied frequency bandwidth. During the reception of terrestrial broadcasting, the phase-locked loop circuit is used to regenerate a carrier and operated as an AM signal demodulator which multiplies the regenerated carrier and the terrestrial broadcasting signal by a multiplier, and the local oscillator is subjected to frequency modulation by a part of the output signal from the phase-locked loop circuit, thereby effecting an automatic frequency control operation.

By virtue of the above-described arrangement, it is possible to receive and demodulate both a satellite broadcasting signal (FM signal ) and a terrestrial broadcasting signal (AM signal) with the same one receiving system.

BRIEF DESCRIPTION OF THE DRAWINGS

FIG. 1 is a block diagram of a signal receiver in accordance with one embodiment of the present invention;

FIG. 2 is a block diagram of the phase-locked loop circuit shown in FIG. 1;

FIG. 7 shows one example of the arrangement of the intermediate frequency filter shown in FIG. 1 when it is a bandwidth variable filter;

FIG. 19 is a graph showing changes in the closed loop characteristics in accordance with the change in the bandwidth of the loop filter in the phase-locked circuit shown in FIG. 2 and with the change in the bandwidth of the filter in the FM negative feedback loop;

FIG. 22 is a circuit diagram of a tracking filter employed as the intermediate frequency filter shown in FIG. 1.

DESCRIPTION OF THE PREFERRED EMBODIMENTS

Figure 3:
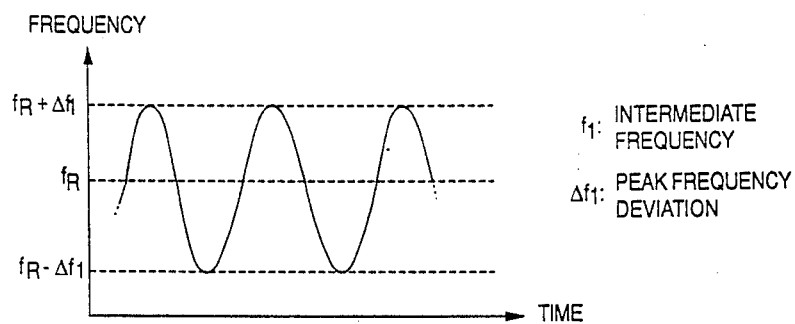
FIG. 3 is a graph showing the peak frequency deviation of the FM signal supplied to the mixer shown in FIG. 1.

FIG. 1 is a block diagram of a signal receiver in accordance with one embodiment of the present invention.

Referring to FIG. 1, a terrestrial broadcasting signal (AM signal) and a satellite broadcasting signal (FM signal) are simultaneuously input to a input terminal 1. These signals are passed through a filter 2 where noises in frequency bands other than the receive frequency band are removed, and then supplied to a radio frequency amplifier 3. The amplifier 3 is a broad-band amplifier which covers frequency bands of the terrestrial broadcasting signals, i.e., 50 MHz to 890 MHz, and frequency bands of the satellite broadcasting signals, i.e., 950 MHz to 1450 MHz. The amplifier 3 supplies the amplified signals to a mixer 4.

On the other hand, a channel selection control signal from a channel selection circuit 16 is supplied to a tuning voltage generator 15, from which a tuning voltage which corresponds to a desired receive channel is supplied to a local oscillator 5. Thus, the terrestrial and satellite broadcasting signals are mixed with a local oscillation signal from the local oscillator 5 and frequency-converted into intermediate frequency signals in a same frequency band before entering into an intermediate frequency filter 7.

Assuming that the received signal is a satellite broadcating signal, which is FM signal, the intermediate frequency signal passed through the intermediate frequency filter 7 enters into a phase-locked loop circuit 8. The phase-locked loop circuit 8 operates in phase with the frequency of the input signal to demodulate the input FM signal.

The demodulated signal is supplied to the local oscillator 5 after being passed through a filter 6 which removes unnecessary higher harmonics from the demodulated signal. The local oscillator 5 is a voltage-controlled variable frequency oscillator. Thus, when the above-described demodulated signal is superposed on the frequency control voltage, the local oscillator 5 undergoes frequency modulation in accordance with the demodulated signal. The polarity of this frequency modulation is set so as to be the same as the modulation polarity of the received signal supplied to the mixer 4.

The frequency modulation of the local oscillator 5 will be detailed below with reference to FIGS. 3 to 5.

Figure 4:
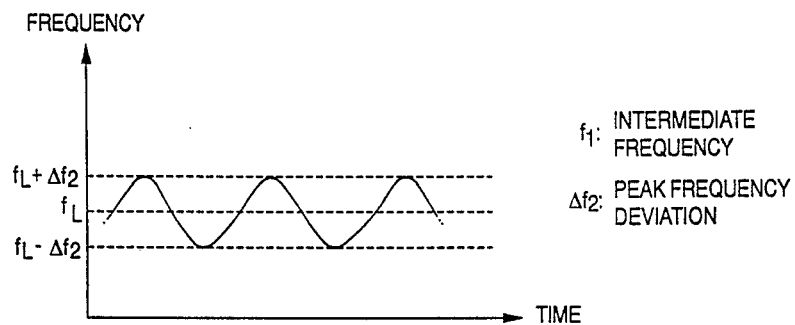
FIG. 4 is a graph showing the peak frequency deviation of frequency modulation applied to the local oscillator shown in FIG. 1 in the FM negative feedback operation.

FIG. 3 is a graph showing the frequency deviation of the FM signal input to the mixer 4, in which time is plotted along the axis of abscissas and the instantaneous frequency of the FM signal is plotted along the axis of ordinates.

In this case, the peak frequency deviation is $\Delta f_1(>0)$. As described above, the local oscillator 5 is subjected to frequency modulation by the demodulated signal such that the peak frequency deviation of the FM signal is $\Delta f_2(>0)$ as shown in FIG. 4. The modulation polarity is the same as the modulation polarity shown in FIG. 3. Assuming that the center frequency of the received signal is $f_R$ and the center frequency of the local oscillation signal is $f_L$, the intermediate frequency signal $f_i$, which is the output signal from the mixer 4, is expressed as follows: $f_i = f_L - f_R$. Accordingly, when the signal which has been frequency-modulated enters into the mixer 4, the output signal from the mixer 4 is expressed as follows:

$$f_L - f_R = (f_L + \Delta f_1) - (f_R - \Delta f_2)$$
$$= f_i - \Delta f_3 \; (\because f_i = f_L - f_R, \Delta f_3 = f_1 - f_2)$$

Figure 5:
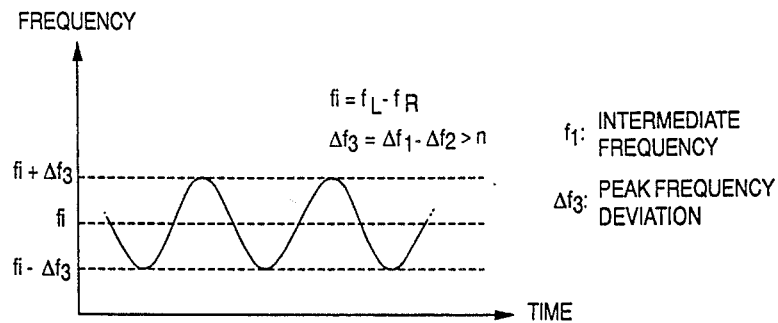
FIG. 5 is a graph showing the peak frequency deviation of the intermediate frequency signal after the FM negative feedback operation.

As a result, it is possible to obtain a signal of which the center frequency is $f_i$, the peak frequency deviation is $\Delta f_3$ and the modulation polarity is opposite to that of the received signal, as shown in FIG. 5.

Accordingly, assuming that the peak frequency deviation of the received signal is $\Delta f_1$ and the top baseband frequency thereof is $f_m$, the occupied frequency bandwidth $B_R$ of the received signal is obtained according to Curson's rule as follows:

$$B_R = 2 \cdot (\Delta f_1 + f_m)$$

On the other hand, the occupied frequency bandwidth $B_I$ of the inermediate frequency signal is as follows:

$$B_R = 2 \cdot (\Delta f_3 + \Delta f_m) < B_R \text{ where } \Delta f_3 < \Delta f_1$$

Figure 6:
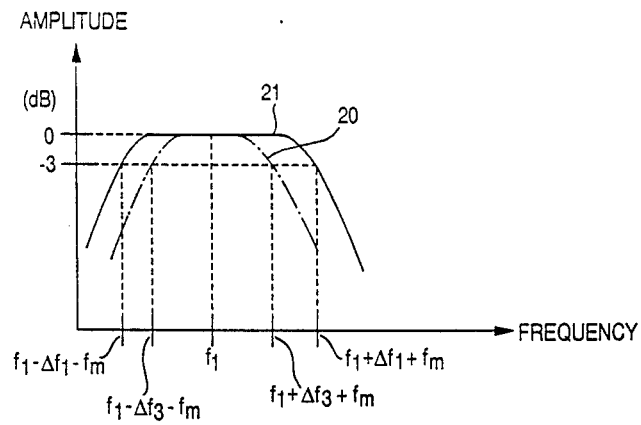
FIG. 6 is a graph showing characteristics of the intermediate frequency filter shown in FIG. 1 when it is a bandwidth variable filter.

Thus, the occupied frequency bandwidth can be narrowed, and it is possible to narrow the pass bandwidth of the intermediate frequency filter as shown by the one-dot chain line 20 in FIG. 6.

Accordingly, it is possible to adjust the level of the demodulated signal in the filter 6 so that the FM signal has a frequency deviation which is equivalent to that in the case of the occupied frequency bandwidth of a terrestrial broadcasting signal.

Let us assume that the received signal is a terrestrial broadcasting signal, which is an AM signal. The intermediate frequency signal passed through the intermediate frequency filter 7 is supplied to the phase-locked loop circuit 8. The phase-locked loop circuit 8 operates in phase with the picture carrier in the intermediate frequency signal supplied thereto to regenerate a carrier which is phase locked with the same frequency as the picture carrier in the intermediate frequency signal.

Referring to FIG. 2, in the phase-locked loop circuit 8, the intermediate frequency signal which is supplied through the intermediate frequency filter 7 is input to a phase comparator 19. A signal oscillated in a voltage-controlled oscillator 18 is input to the phase comparator 19 where it is subjected to a phase comparison with the intermediate frequency signal. The output signal from the phase comparator 19 is supplied to a loop filter 17. The loop filter 17 consists of a filter which effects band limitation and a DC amplifier, and enables the phase-locked state of the phase-locked loop circuit 8 to be varied by changing the cut-off frequency and voltage gain. The output signal from the phase comparator 19 which has been subjected to band limitation in the loop filter 17 is input to the voltage-controlled oscillator 18 to change the oscillated signal in a direction in which the phase difference between the oscillated signal and the intermediate frequency signal is compressed. Accordingly, the oscillation frequency of the voltage-controlled oscillator 18 is coincident with the intermediate frequency.

Thus, to regenerate the picture carrier in the intermediate frequency signal, the bandwidth of the loop filter 17 is narrowed to such an extent that frequency fluctuation due to undesirable noises is satisfactorily suppressed and the picture carrier is stably regenerated.

The picture carrier which has been regenerated with a high fidelity to the intermediate frequency signal has a phase difference of $\pi/2(\text{rad})$ with respect to the picture carrier in the intermediate frequency signal. Therefore, the regenerated picture carrier is input to a $\pi/2$ phase shifter 10 to make it in-phase with the picture carrier in the intermediate frequency signal. The output of the $\pi/2$ phase shifter 10 and the intermediate frequency signal are input to a multiplier 12 to effect synchronous detection of the AM signal.

At this time, the phase-locked loop circuit 8 is completely synchronized with the picture carrier in the intermediate frequency signal. Therefore, when there is fluctuation in the frequency of the intermediate frequency signal, a detected signal which changes in accordance with the frequency fluctuation appears at the output end of the circuit 8. This output signal is adequately smoothed in the filter 6, and then input to the local oscillator 5 so as to frequency-modulate local oscillator 5, thus causing the local oscillator 5 to effect automatic frequency control in regard to the frequency fluctuation of the input signal. Thus, the frequency fluctuation of the intermediate frequency signal supplied to the phase-locked loop circuit 8 is suppressed, and this contributes to stabilization of the phase-locked loop circuit 8 to a substantial extent.

The demodulated FM or AM signal is selected in a signal switching circuit 9 and the selected signal is suppiled to a signal processing circuit 13, where the FM signal is processed to a signal for display in a de-emphasis circuit, while the AM signal is processed to a display signal in a circuit which compensates the frequency characteristics of the signal after the vestigial side-band detection. The processed FM or AM signal is then displayed on a display unit (e.g., CRT) 14.

Channel selection of the input signal is effected in such a manner that a channel selection control signal from the channel selection circuit 16 is supplied to the tuning voltage generator 15 and a tuning voltage corresponding to a desired receive channel is supplied to the local oscillator 5 from the tuning voltage generator 15 to change the oscillation frequency of the local oscillator 15.

A control voltage which changes the bandwidth of the intermediate frequency filter 7, the loop filter 17 in the phase-locked loop circuit 8 and the filter 6 in the FM negative feedback loop is also generated by supplying a control signal corresponding to a desired receive channel to the control voltage generator 11 from the channel selection circuit 16, thus generating a control voltage corresponding to an FM or AM signal. In response to the control voltage generated from the control voltage generator 11, the pass bands of the intermediate frequency filter 7 and the loop filter 17 in the phase-locked loop circuit 8 are changed according to whether an FM or AM signal is desired to be received.

Thus, according to this embodiment, the radio frequency amplifier, the mixer and the local oscillator are used in common for reception of satellite and terrestrial broadcasting signals, and the intermediate frequency filter can be used in common by using the same intermediate frequency and equivalent occupied bandwidths for reception of satelliete and terrestrial broadcasting signals. Since the demodulator is also operated at the same frequency, a part of the FM signal demodulator can be utilized as an AM signal demodulator. Accordingly, it is possible to simplify the circuit configuration as compared with that in the conventional receiving method. In the demodulation of the FM signal, the local oscillator is inversely modulated by a part of the demodulated signal, and this effects an FM negative feedback operation, resulting in an improvement in the threshold level which has heretofore caused a problem during the reception of satellite broadcasting. In reception of terrestrial broadcasting, an automatic frequency control operation is effected to perform stable carrier regeneration. In addition, it is possible to improve immunity performance by setting the intermediate frequency at a higher frequency than the frequency band used in reception of terrestrial broadcasting signals including those which are handled in CATV that has a large number of channels.

FIG. 7 shows one example of the arrangement of the intermediate frequency filter 7 shown in FIG. 1. In this example, the intermediate frequency filter 7 is a band-pass filter in which a low-pass filter 22 and a high-pass filter 24 are respectively connected to the input and output ends of a broad band amplifier 23. The low- and high-pass filters 22, 24 are arranged such that the cut-off frequencies thereof are variable without interfering with each other in response to a control signal delivered from the control voltage generator 11. In the case where the intermediate frequency signal output from the mixer 4 is an AM signal, the cut-off frequency of the low-pass filter 22 is made lower than that in the case of reception of an FM signal, while the cut-off frequency of the high-pass filter 24 is made higher than that employed in the FM signal receiving mode, thereby making the pass bandwidth narrower than that in the FM signal receiving mode so as to suppress the signals in channels other than the desired channel during the AM signal receiving operation, and thus improving the immunity performance. With the above-described control voltage, it becomes easy to set a desired bandwidth, and it is possible to adjust the bandwidth in accordance with the degree of the FM negative feedback factor. Further, in the case of reception of an AM signal it is possible to suppress interference due to a multiplicity of channels by narrowing the bandwidth.

Figure 8:
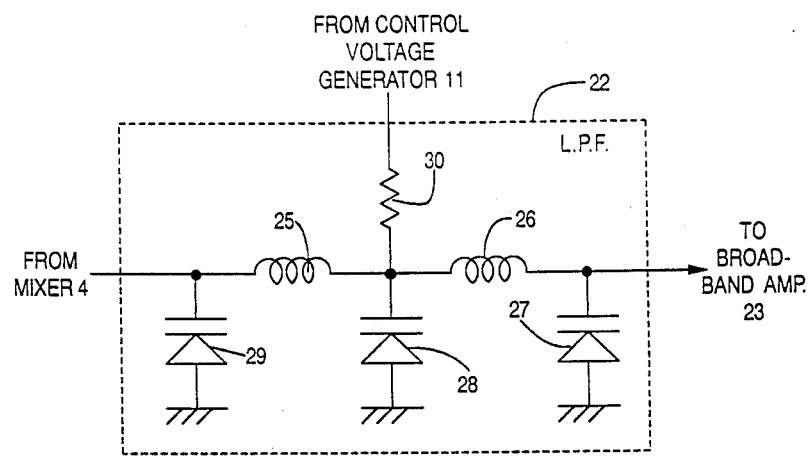
FIG. 8 is a circuit diagram of a low-pass filter employed to constitute a bandwidth variable filter as the intermediate frequency filter shown in FIG. 1.

FIG. 8 is a circuit diagram of the low-pass filter 22 employed to constitute the intermediate frequency filter 7 shown in FIG. 7. The low-pass filter 22 consists of coils 25, 26 and varactor diodes 27, 28, 29. A control voltage is supplied to the cathode of each varactor diode from the control voltage generator 11 through a resistor 30. When the control voltage is lowered, the cut-off frequency is lowered, so that it is possible to lower the upper cut-off frequency of the intermediate frequency filter 7.

Figure 9:
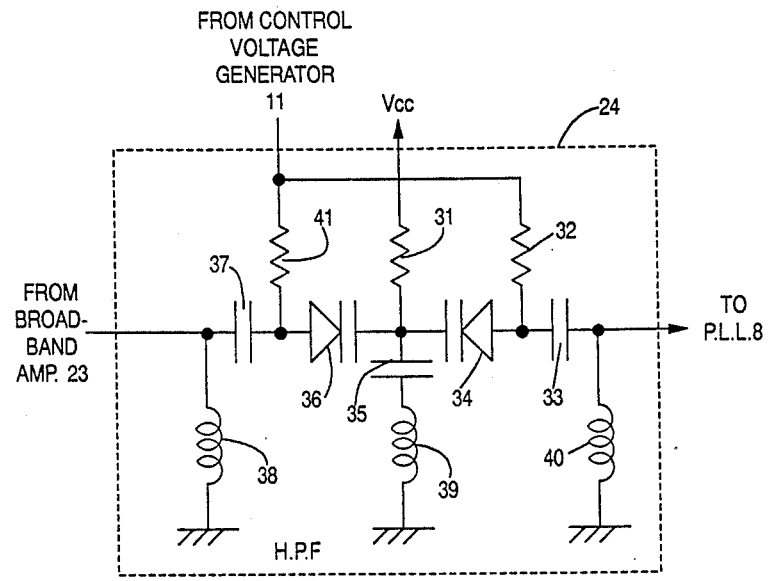
FIG. 9 is a circuit diagram of a high-pass filter employed to constitute a bandwidth variable filter as the intermediate frequency filter shown in FIG. 1.

FIG. 9 is a circuit diagram of the high-pass filter 24 employed to constitute the intermediate frequency filter 7 shown in FIG. 7. The high-pass filter 24 consists of coils 38, 39, 40 and varactor diodes 34, 36. A control voltage is supplied to the anodes of the varactor diodes from the control voltage generator 11 through resistors 32, 41, respectively. The potential at the cathode of each varactor diode is pulled up to a power supply voltage $V_{CC}$ through a resistor 31. Accordingly, when the control voltage is lowered, the cut-off frequency is raised, so that it is possible to raise the lower cut-off frequency of the intermediate frequency filter 7.

As described with reference to FIGS. 8 and 9, since the pass bandwidth of the band-pass filter can be varied as desired, even when the FM negative feedback operation is performed, it is possible to realize characteristics 20 (shown by the one-dot chain line) having a narrower bandwidth than that of the characteristics 21 (shown by the solid line) in the prior art, as shown in FIG. 6.

Figure 10:
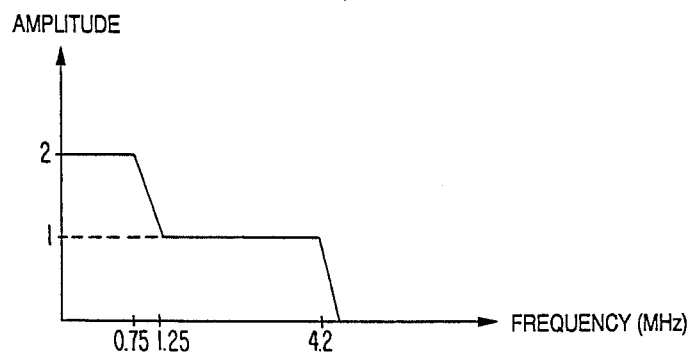
FIG. 10 is a graph showing the spectrum of a terrestrial broadcasting wave which has been sampled and subjected to AM signal demodulation by a broad-band filter.

FIG. 10 shows the spectrum of a demodulated signal obtained by demodulating an AM signal in the case where the intermediate frequency filter 7 is a band-pass filter. The television broadcasting wave that is used in the existing terrestrial broadcasting is an AM signal having a vestigial side-band. Accordingly, if the whole band for one channel is passed through a band-pass filter and the AM signal is subjected to synchronous detection with the picture carrier frequency, the amplitude level of the demodulated signal doubles only in the band corresponding to the vestigial side-band, resulting in uneven frequency characteristics. Since the vestigial side-band in the case of the television signal in the NTSC system is within the range of 1.25 MHz from the vido carrier frequency, the amplitude level of the demodulated signal in the band of from 0 to 1.25 MHz is also double that in the band which is higher than it. As to the band of from 0 to 1.25 MHz, it is effective that the S/N ratio in said band is 3 dB higher than that in the higher band.

Figure 11:
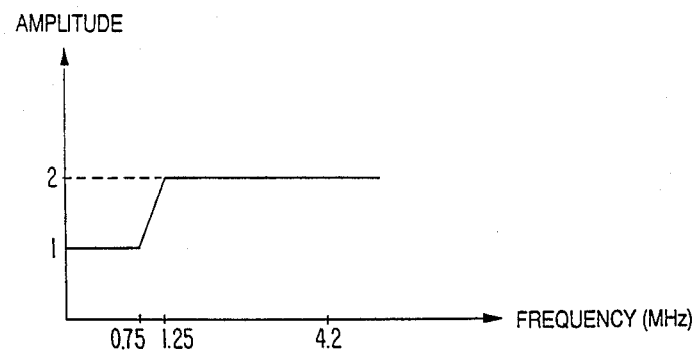
FIG. 11 is a graph showing characteristics of an inverse characteristic filter for flattening the frequency characteristics of a signal obtained by sampling and amplitude-demodulating a terrestrial broadcasting signal by a broad-band filter.

FIG. 11 shows filter characteristics adequate to flatten the frequency characteristics of the demodulated signal described with reference to FIG. 10. With the illustrated filter characteristics, the amplitude level within the band of from 0 to 1.25 MHz is reduced to a half of the amplitude level in the band that is higher than said band. Accordingly, if the demodulated signal having the spectrum shown in FIG. 10 is passed through a filter having the characteristics shown in FIG. 11, it is possible to obtain an original, flat demodulated signal. Thus, it is possible to maximize the S/N ratio of the transmitted signal without deteriorating the S/N ratio in the low frequency band.

Figure 12:
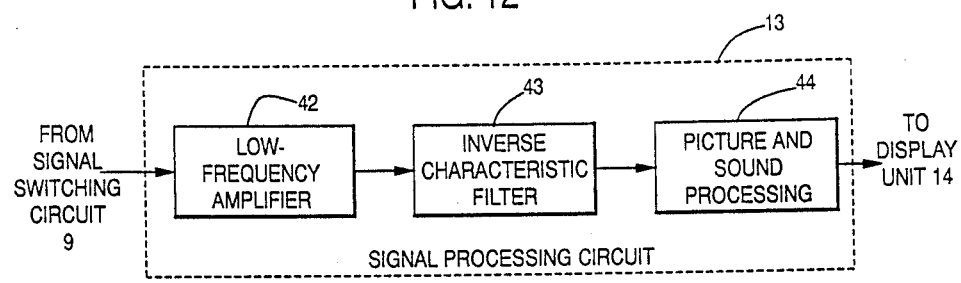
FIG. 12 is a block diagram of the signal processing circuit shown in FIG. 1 which has the characteristics shown in FIG. 11.

FIG. 12 is a block diagram of the signal processing circuit 13 that employs an inverse characteristic filter having the characteristics described with reference to FIG. 11. The demodulated signal output from the signal switching circuit 9 is supplied to a low-frequency amplifier 42 where it is amplified. The amplified signal is then supplied to an inverse characteristic filter 43 where its amplitude-frequency characteristics are restored to the flat ones. Thereafter, the signal enters into a picture and sound signal processing circuit 44 where picture and sound signals are taken out, and these signals are then supplied to the display unit 14.

Figure 13:
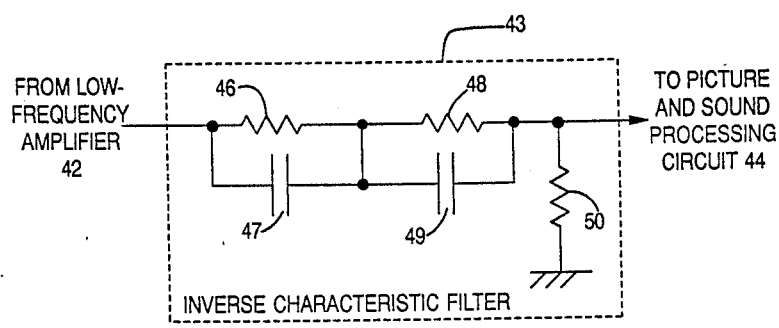
FIG. 13 is a circuit diagram of the inverse characteristic filter shown in FIG. 12.

FIG. 13 shows one example of the arrangement of the inverse characteristic filter 43 shown in FIG. 12. The signal output from the low-frequency amplifier 42 is passed through a filter which consists of a parallel resonance circuit composed of resistors 46, 48 and capacitors 47, 49 and a resistor 50 which is connected between the output end of the resonance circuit and the ground. The signal passed through the filter is supplied to the picture and sound signal processing circuit 44. The required frequency characteristics of the inverse characteristic filter can be obtained by setting the resonance frequency of the parallel resonance circuit at about 1.25 MHz, the resonance circuit consisting of first parallel circuit composed of the resistor 46 and the capacitor 47 and a second parallel circuit composed of the resistor 48 and the capacitor 49.

Although the illustrated filter is arranged using passive elements, such arrangement is not necessarily limitative, and it is also possible to obtain a similar effect by employing an active filter using active elements or a digital filter. In other words, any kind of filter may be employed, provided that the inverse charactersitics can be obtained.

Figure 14:
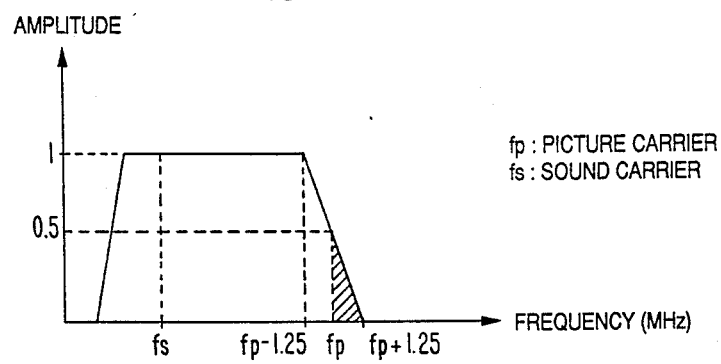
FIG. 14 is a graph showing the frequency characteristics of the intermediate frequency filter shown in FIG. 1 when it is a Nyquist filter.

FIG. 14 is a graph showing the frequency characteristics of the intermediate frequency filter 7 which is defined by a band-pass filter a part of whose characteristics is Nyquist characteristic with respect to the picture carrier. Since the television broadcasting wave that is used in the existing terrestrial broadcasting is an AM signal having a vestigial side-band, it suffices, in order to flatten the frequency characteristics of the signal at the time of demodulation, to demodulate the signal by passing it through a filter having Nyquist characteristic by which the amplitude of the picture carrier is halved. This technique is utilized in the first intermediate frequency filter in the present television receivers. For example, it is possible to employ the characteristics of a filter which is introduced in Television Picture Engineering Handbook, Vol. 10, Chapter 1, pp. 963–965, 1980, by The Institute of Television Engineers of Japan. If a filter having said characteristics is employed, it is unnecessary to flatten the complicated frequency characteristic of the demodulated signal and the circuit configuration is simplified. The hatched portion in the figure shows frequency characteristics at the time when the vestigial side-band is suppressed. Thus, the Nyquist filter has inverse characteristics over the range of from $-1.25$ to $1.25$ MHz with respect to the picture carrier frequency $f_p$. The sound carrier is not suppressed. The bandwidth of the Nyquist filter as the intermediate frequency filter 7 is made wider than the band for one channel of television broadcasting, thereby enabling the filter to deal with satellite broadcasting waves.

Figure 15:
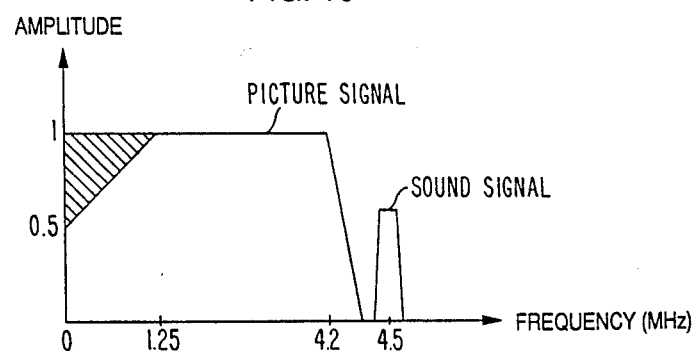
FIG. 15 is a graph showing the spectrum of a signal obtained by AM signal demodulation carried out in the intermediate frequency filter shown in FIG. 1 which is a Nyquist filter.

FIG. 15 is a graph showing the spectrum of a demodulated signal obtained in such a manner that the signal passed through the intermediate frequency filter having the characteristics shown in FIG. 13 is subjected to synchronous detection with the picture carrier and thus demodulated. By virtue of the Nyquist characteristic of the intermediate frequency filter shown in FIG. 13, the amplitude level in regard to the vestigial side-band the frequency of which is higher than the picture carrier frequency $f_p$ is suppressed, which results in the hatched spectrum. In regard to the band which is lower than the picture carrier frequency $f_p$, the spectrum of the demodulated signal shows inverse characteristics with respect to the vestigial side-band component at 1.25 MHz or less. By the synchronous detection with the picture carrier, the two characteristics are mixed together at the time of demodulation, resulting in a demodulated signal having flat frequency characteristics. In the example shown in FIGS. 14 and 15, the inverse characteristic filter 43 shown in FIG. 12 is not needed. Thus, the demodulated signal supplied from the signal switching circuit 9 is amplified in the low-frequency amplifier 42. The amplified signal is then supplied to the picture and sound signal processing circuit 44 where picture and sound signals are taken out, and these signals are supplied to the display unit 14. By imparting Nyquist characteristic to the intermediate frequency filter 7, the frequency characteristics of the demodulated signal become flat, and it is unnecessary to insert an inverse characteristic filter. Accordingly, the circuit configuration is simplified.

Figure 16:
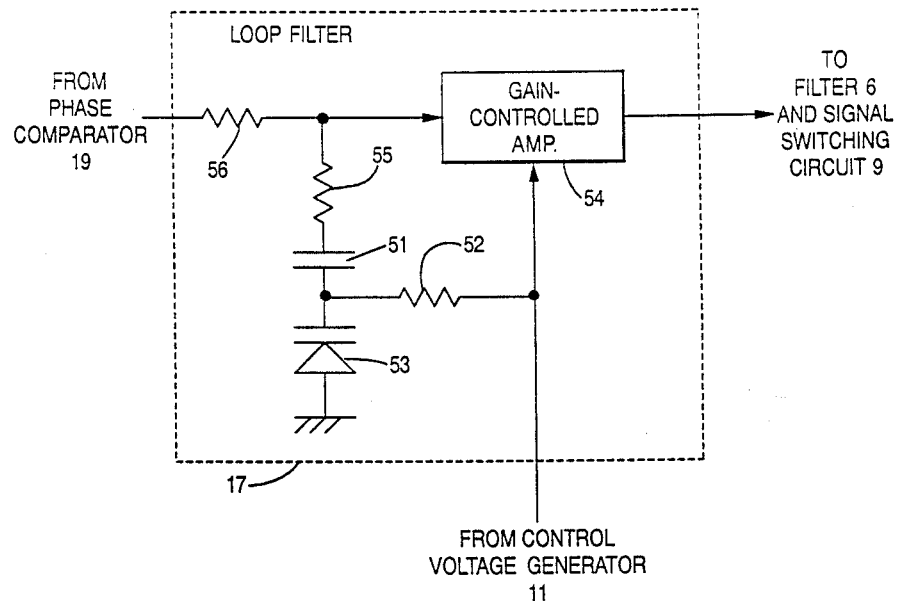
FIG. 16 is a circuit diagram of a bandwidth variable filter employed to define the loop filter that constitutes the phase-locked loop circuit shown in FIG. 2.

FIG. 16 shows one example of the arrangement of the loop filter 17 in the phase-locked loop circuit 8 shown in FIG. 2.

In the case of reception of an FM signal, the cut-off frequency of the loop filter 17 is set at an optimal frequency in accordance with the peak frequency deviation and the top baseband frequency of the modulated signal. However, in the case of reception of an AM signal, the phase-locked loop circuit 8 operates as a picture carrier regenerating circuit. Accordingly, in order to regenerate a stable carrier, it is necessary to suppress noises in the vicinity of the carrier, and therefore the cut-off frequency of the loop filter 17 is made substantially lower than that in the case of the FM signal receiving mode. For example, the bandwidth of the loop when used to demodulate an FM signal needs to be 30 to 40 MHz, whereas, when the loop is used to demodulate an AM signal, the bandwidth is limited to several hundreds kHz. The change of the bandwidth is effected as follows. A preset channel selection signal which is delivered from the channel selection circuit 16 is supplied to the control voltage generator 11, from which, when an FM signal is received, a relatively high voltage is generated in accordance with the desired receive channel, whereas, when an AM signal is received, a relatively low voltage is generated in accordance with the desired receive channel. The contol voltage is supplied to the cathode of a varactor diode 53 through a resistor 52. Since the cut-off frequency is determined in accordance with the resistances of the resistors 56, 55 and the capacitance of the varactor diode 53, when the control voltage is relatively high, the capacitance is relatively small, and the cut-off frequency is raised so as to enable the loop filter 17 to cope with the demodulation of an FM signal, whereas, when the control voltage is relatively low, the capacitance is large, and the cut-off frequency is lowered so as to enable the loop filter 17 to cope with the demodulation of an AM signal.

Figure 18:
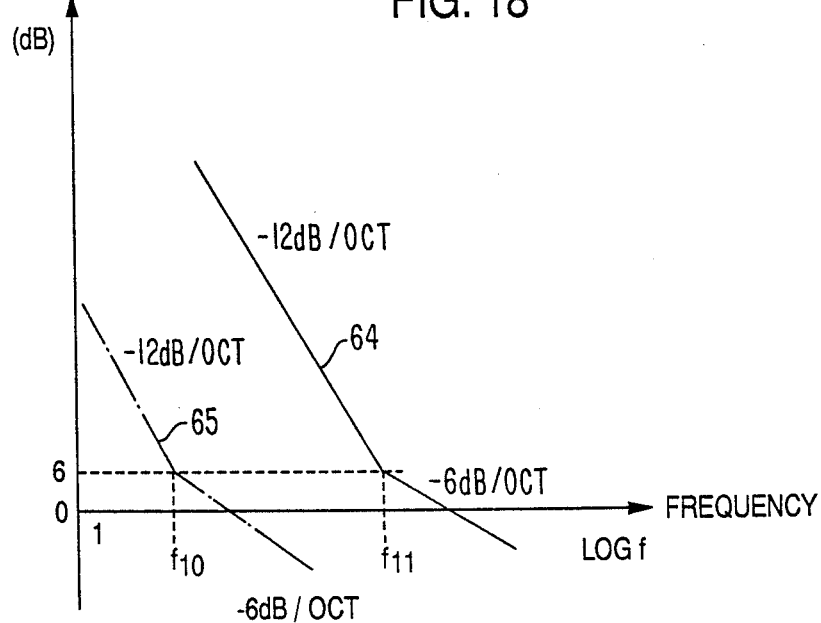
FIG. 18 is a graph showing changes in the open loop characteristics in accordance with the change in the bandwidth of the loop filter in the phase-locked loop circuit shown in FIG. 2 and with the change in the bandwidth of the filter in the FM negative feedback loop.

Thus, as shown in FIG. 18, when an FM signal is received, the open-loop transmission characteristics of the phase-locked loop circuit 8 are such as those represented by the characteristic curve 64, and the cut-off frequency is set at $f_{11}$, whereas, when an AM signal is received, the cut-off frequency is lowered to $f_{10}$ as shown by the characteristic curve 65.

At this time, if the capacitance of the varactor diode 53 is merely increased, the cut-off frequency $f_{11}$ lowers but moves along the 12 dB/OCT section of the characteristic curve 65, so that it is impossible to set the open-loop gain of the open-loop transmission characteristis at 6 dB at the cut-off frequency that is required for the phase-locked circuit 8 to operate stably. As a result, the open loop gain exceeds 6 dB, and the stability is lost. Accordingly, it is necessary to lower the open-loop gain over the whole band, and therefore the gain of a gain-controlled amplifier 54 is lowered in accordance with the control voltage delivered from the control voltage generator 11, thereby enabling the open-loop gain at the cut-off frequency $f_{10}$ to be set at 6 dB. Thus, when an FM signal is received, the closed-loop transmission characteristics of the phase-locked loop circuit 8 are such as those represented by the characteristic curve 66 and the natural frequency within the loop is $f_{13}$, whereas when an AM signal is received, the closed-loop transmission characteristics are such as those represented by the characterstic curve 67 and the natural frequency is lowered to $f_{12}$. If the natural frequency is generally represented by $f_n$, the equivalent noise bandwidth $B_n$ at that time is expressed as follows:

$$Bn = \frac{f_n}{2}\left(\zeta + \frac{1}{4\zeta}\right)$$

In the above formula, $\zeta$ is the damping factor of the loop which is determined by the open-loop gain at the cut-off frequency shown by the open-loop transmission characteristics, the damping factor being a parameter which loop determines the lock-in time and range of the phase-locked circuit 8. The stability of the phase-locked loop circuit is described, for example, in Jacob Klapper et al. "Phase-Locked and Frequency-Feedback Systems", Academic Press, Inc., 1972. As expressed by the above formula, the lowering of the cut-off frequency shown in FIG. 18 leads to the lowering in the natural frequency shown in FIG. 19, thus reducing the equivalent noise bandwidth of the phase-locked loop circuit 8. As a result, the phase-locked loop circuit 8 becomes suitable for regeneration of the picture carrier at the time of reception of an AM signal.

As to the phase comparator 19 and the voltage-controlled oscillator 18 which ar the other elements that constitute the phase-locked loop circuit 8 in combination with the loop filter 17 their characteristics need not be changed irrespective of whether the received signal is an FM or AM signal; therefore, it is only necessary to change the cut-off frequency of the loop filter 17 and the gain of the gain-controlled amplifier.

Figure 17:
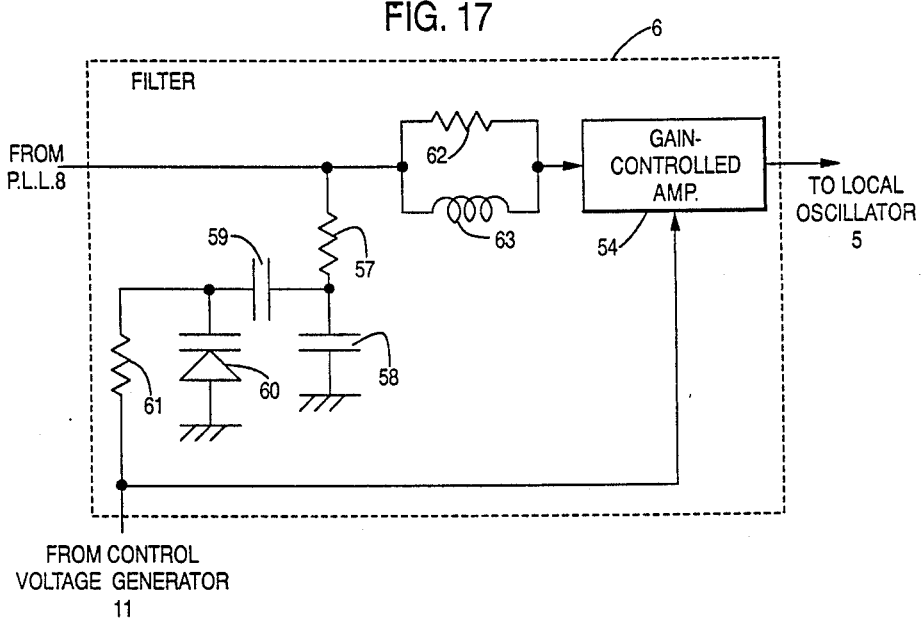
FIG. 17 is a circuit diagram of a bandwidth-variable filter employed as the filter that constitutes the FM negative feedback loop shown in FIG. 1.

FIG. 17 shows one example of the arrangement of the filter 6 which constitutes the FM negative feedback loop shown in FIG. 1. In the case of reception of an FM signal, the cut-off frequency of the filter 6 is set at an optimal frequency in accordance with the peak frequency deviation and the top baseband frequency of the modulated signal. However, when the received signal is an AM signal, the FM negative feedback loop operates as an automatic frequency control loop, it is necessary to sufficiently lower the cut-off frequency of the filter 6 in order to suppress the fluctuation of the oscillation frequency of the local oscillator 5 due to undesirable noises in the high frequency band. Accordingly, the control voltage generated from the control voltage generator 11 is changed in accordance with the channel selection signal delivered from the channel selection circuit 16. The control voltage delivered from the control voltage generator 11 is supplied to the cathode of a varactor diode 60 through a resistor 61.

By lowering the control voltage, the capacitance of the varactor diode 60 is increased, thereby lowering the cut-off frequency which is determined by the capacitance of the varactor diode 60 and the resistance of a resistor 57. A capacitor 58 is added only when the capacitance of the varactor diode 60 is insufficient. The filter characteristics are determined by a resistor 62, a coil 63, the resistance 57 and the varactor diode 60, but the cut-off frequency can be changed simply by changing the time constant which is determined by the resistor 57 and the varactor diode 60. However, if the cut-off frequency alone is lowered, the overall open-loop gain, particularly the automatic frequency control range, is not optimized as in the case of the phase-locked loop circuit 8 described with reference to FIG. 16. Therefore, the gain of the gain-controlled amplifier 54 is also adjusted in accordance with the control voltage. Since the open- and closed-loop transmission characteristics obtained by the above-described arrangement are the same as those in the case of the above-described phase-locked loop circuit 8, detailed description thereof is omitted.

As described above, it is possible to selectively effect modulation of AM and FM signals with the same arrangement simply by changing the respective cut-off frequencies of the loop filter 17 in the phase-locked loop circuit 8 and the filter 6 in the FM negative feedback loop.

Figure 20:
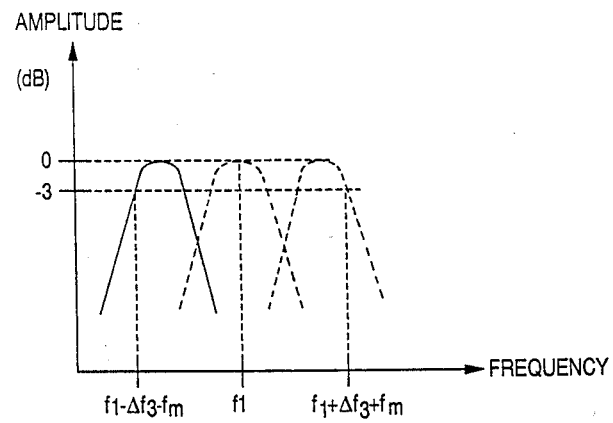
FIG. 20 is a graph showing characteristics of a tracking type filter employed as the intermediate frequency filter shown in FIG. 1.

FIG. 20 is a graph showing characteristics of a frequency-variable filter employed as the intermediate frequency filter in accordance with this embodiment. In the case of reception of an AM signal, the minimum pass bandwidth of the intermediate frequency filter may be set at a bandwidth for one channel of terrestrial broadcasting wave. However, when an FM signal (satellite broadcasting wave) is received, if the minimum pass bandwidth is narrowed to the bandwidth for one channel of terrestrial broadcasting wave, the loop stability is likely to deteriorate. Therefore, the FM negative feedback factor which is in a stable state is set at a wider band than the terrestrial broadcasting wave band, and the pass bandwidth of the intermediate frequency filter is set so as to be substantilly equal to a bandwidth for one channel of terrestrial broadcasting wave and is shifted in synchronism with the instantaneous frequency of the FM signal so that the carrier in the FM signal is passed through the intermediate frequency filter at all times. The pass bandwidth of the intermediate frequency filter is synchronized with the instantaneous frequency Of the FM signal by supplying the demodulated FM signal to the control terminal of the intermediate frequency filter.

Figure 21:
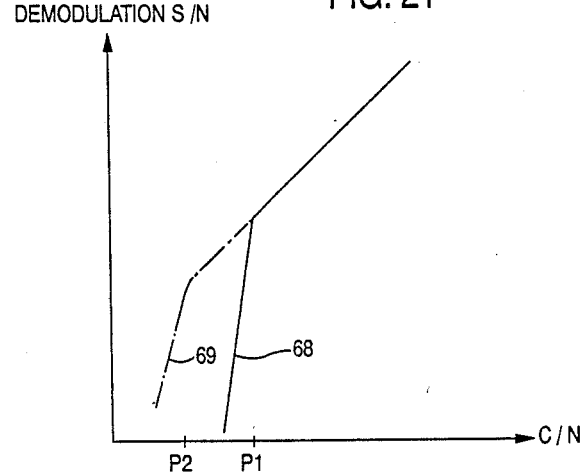
FIG. 21 is a graph showing changes in the demodulation S/N ratio at the time of reception of an FM signal.

Thus, as shown in FIG. 21, the noise power that enters the phase-locked loop curcuit 8 becomes smaller than in the case of the intermediate frequency filter defined by a frequency-fixed filter. As a result, the carrier-to-noise ratio (C/N) is improved, and the threshold level at which a threshold noise which is a characteristic of the FM signal demodulator is generated is increased. Assuming that the threshold level in the case where the signal is received through a frequency-fixed filter is represented by $P_1$, when the C/N ratio is less than $P_1$, the demodulation S/N ratio deteriorates rapidly as shown by the characteristic curve 68. However, in the case where the signal is received by a frequency-variable filter, even when the C/N ratio is less than $P_1$, no rapid deterioration of the demodulation S/N ratio occurs, but the threshold level is improved as far as $P_2$ as shown by the characteristic curve 69. Thus, it is possible to arrange a signal recevier which is advantageously employed to receive weak elecric fields.

FIG. 22 shows one example of the arrangement of the intermediate frequency filter 7 having the characteristics shown in FIG. 20. The illustrated filter 7 has a double-tuned arrangement wherein a resonance circuit consisting of a coil 71 and a varactor diode 77 and a resonance circuit consisting of a coil 72 and a varactor diode 78 are coupled together through a capacitor 70, whereby the frequency characteristics in the pass band can be flattened. When the capacitances of the varactor diodes 77, 78 are reduced, the center frequency in the pass band is raised, whereas, when the capacitances are increased, the center frequency is lowered. Accordingly, when the demodulated signal output from the phase-locked loop circuit 8 is supplied to the cathodes of the varctor diodes 77, 78 through resistors 74, 75, the center frequency of the intermediate frequency filter 7 is shifted in accordance with the instantaneous voltage of the demodulated signal, thus enabling the operation described with reference to FIG. 20.

What is claimed is:

1. A signal receiver for selectively receiving a frequency-modulated signal and an amplitude-modulated signal, comprising:

a radio frequency amplifying means for amplifying a radio frequency signal supplied from an input terminal;

a frequency converting means for frequency-converting the radio frequency signal into an intermediate frequency signal by mixing the radio frequency signal and an oscillation signal from a local oscillator in a mixer;

a signal selecting means for selecting a desired intermediate frequency signal from the signals having been subjected to the frequency conversion;

a channel selecting means for generating a signal required to select a desired receive signal;

a phase-locked loop means having a phase-locked loop circuit which operates in phase with a frequency of the intermediate frequency signal, an output of said phase-locked loop means being a demodulated frequency-modulated signal demodulated from said frequency-modulated signal when said input signal is said frequency-modulated signal;

a frequency feedback means for supplying the output of said phase-locked loop means so that an oscillation frequency of the local oscillator in said frequency converting means is changed in accordance with the output of said phase-locked loop means;

a control signal generating means for generating a control signal for changing respective working bandwidths of said phase-locked loop means, said signal selecting means and said frequency feedback means in response to the signal delivered from said channel selection means;

a tuning voltage generating means for generating and supplying a tuning voltage corresponding to the desired receive signal to the local oscillator in said frequency converting means in response to the signal delivered from said channel selection means;

a phase shifting means for $\pi/2$ phase-shifting the output of said phase-locked loop means;

a multiplying means for multiplying the output signal from said phase-locked loop means which has been $\pi/2$ phase-shifted in said phase shifting means and said intermediate frequency signal, an output of said multiplying means being a demodulated amplitude-modulated signal demodulated from said amplitude-modulated signal when said input signal is said amplitude-modulated signal;

a signal switch in means for selecting one of the outputs of said phase-locked loop means and said multiplying means to output said demodulated frequency-modulated signal when said input signal is said frequency-modulated signal and said demodulated amplitude-modulated signal when said input signal is said amplitude-modulated signal; and a signal processing means for processing an output of said signal switching means to a signal which is able to be displayed.

2. A signal receiver according to claim 1, wherein said signal selecting means is a frequency-fixed filter.

3. A signal receiver according to claim 1, wherein said signal selecting means is a frequency-variable filter the frequency of which is variable in accordance with a control signal from said control signal generating means.

4. A signal receiver according to claim 3, wherein said signal selecting means is arranged such that the pass bandwidth thereof is changeable in accordance with a control signal from said control signal generating means.

5. A signal receiver according to claim 3, wherein said signal selecting means is arranged to perform frequency tracking in accordance with a demodulated signal output from said phase-locked loop means.

6. A signal receiver according to claim 2, wherein said signal selecting means has Nyquist characteristic by which a carrier corresponding to reception of an AM signal is suppressed.

7. A signal receiver according to claim 5, wherein said signal selecting mean employs the same pass bandwidth irrespective of whether the signal which is to be received is an FM or AM signal.

8. A signal receiver according to claim 4, wherein said signal selecting means changes the pass bandwidth in accordance with a control signal from said control signal generating means which control signal is representative of whether the signal which is to be received is an FM or AM signal.

9. A signal receiver according to claim 4, wherein said signal selecting means is arranged such that a signal is passed through a low-pass filter, amplified in a broadband amplifier and then passed through a high-pass filter, the respective cut-off frequencies of the low and high-pass filters being changed in accordance with a control signal from said control signal generating means, thereby changing the pass bandwidth.

10. A signal receiver according to claim 1, wherein the loop bandwidth of said phase-locked loop circuit is changed in accordance with a control signal from said control signal generating means so that the bandwidth employed at the time of reception of an AM signal is narrower than that employed at the time of reception of an FM signal.

11. A signal receiver according to claim 1, wherein the loop bandwidth of an FM negative feedback loop is changed in accordance with a control signal from said control signal generating means so that the bandwidth employed at the time of reception of an AM signal is narrower than that employed at the time of reception of an FM signal.

12. A signal receiver according to claim 10, wherein said phase-locked loop means operates such that an output signal from a phase comparator which detects a phase difference between an oscillation signal from a voltage-controlled oscillator and an input signal is fed back to said voltage-controlled oscillator through a loop filter which effects band limitation so as to minimize the output signal from said phase comparator, said loop filter being composed of a filter section in which the output signal from said phase comparator is input to one end of a first resistor and a second resistor and a variable-capacitance element are series-connected between the other end of the first resistor and a ground electrode, and a gain-controlled amplifier which amplifies a signal taken out from the other end of said frist resistor, the loop bandwidth being varied by simultaneously changing the capacitance of said variable-capacitance element and the gain of said amplifier.

13. A signal receiver according to claim 10, wherein said frequency feedback loop means includes a filter which comprises a filter section in which the output signal from said phase-locked loop means is input to one end of a first resistor, and a second resistor and a variable-capacitance element are series-connected between the input end and a ground electrode, said first resistor having a coil connected in parallel to it, and a gain-controlled amplifier which amplifies a signal taken out from the other end of said first resistor, the loop bandwidth being varied by simultaneously changing the capacitance of said variable-capacitance element and the gain of said amplifier.

14. A signal receiver according to claim 1, wherein said signal processing means comprises a low-frequency amplifier which amplifies a demodulated signal, an inverse characteristic filter which compensates the frequency characteristics of the amplified signal, and a picture and sound signal processing circuit which decodes the compensated signal into a signal which is able to be displayed, whereby the increase in amplitude of the low-frequency component of the demodulated signal at the time of reception of an AM singal having a vestigial side-band is suppressed by the inverse characteristic filter.

15. A signal receiver according to claim 14, wherein said inverse characteristic filter is arranged such that a signal from the low-frequency amplifier is input to one end of a series circuit formed from a first parallel resonance circuit composed of a frist resistor and a first capacitor and a second parallel resonance circuit composed of a second resistor and a second capacitor, and a third resistor is connected between the other end of said second parallel resonance circuit and a ground electrode, so that a signal is taken out from the node between the third resistor and said second parallel resonance circuit and supplied to said picture and sound signal processing circuit.

* * * * *